(12) United States Patent
Hori et al.

(10) Patent No.: US 11,700,771 B2
(45) Date of Patent: Jul. 11, 2023

(54) ASSEMBLY OF PIEZOELECTRIC MATERIAL SUBSTRATE AND SUPPORT SUBSTRATE, AND METHOD FOR MANUFACTURING SAID ASSEMBLY

(71) Applicant: NGK INSULATORS, LTD., Nagoya (JP)

(72) Inventors: Yuji Hori, Owariasahi (JP); Takahiro Yamadera, Nagoya (JP); Tatsuro Takagaki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 506 days.

(21) Appl. No.: 16/834,159

(22) Filed: Mar. 30, 2020

(65) Prior Publication Data
US 2020/0227623 A1 Jul. 16, 2020

Related U.S. Application Data

(63) Continuation of application No. PCT/JP2018/041798, filed on Nov. 12, 2018.

(30) Foreign Application Priority Data

Dec. 28, 2017 (JP) .................. 2017-252831

(51) Int. Cl.
*H10N 30/072* (2023.01)
*C30B 29/30* (2006.01)
(Continued)

(52) U.S. Cl.
CPC ........... *H10N 30/072* (2023.02); *C30B 29/30* (2013.01); *H03H 3/08* (2013.01); *H03H 9/25* (2013.01);
(Continued)

(58) Field of Classification Search
None
See application file for complete search history.

(56) References Cited

U.S. PATENT DOCUMENTS 9,385,301 B2 7/2016 Kando et al.
10,014,162 B2 7/2018 Taniguchi et al.
(Continued)

FOREIGN PATENT DOCUMENTS

JP 3774782 B2 5/2006
JP 2006304206 A 11/2006
(Continued)

OTHER PUBLICATIONS

English translation of JPH0730354A (Year: 1995).*
(Continued)

*Primary Examiner* — Xiaoming Liu
(74) *Attorney, Agent, or Firm* — Flynn Thiel, P.C.

(57) ABSTRACT

A bonded body includes a supporting substrate, silicon oxide layer provided on the supporting substrate, and a piezoelectric material substrate provided on the silicon oxide layer and composed of a material selected from the group consisting of lithium niobate, lithium tantalate and lithium niobate-lithium tantalite. A nitrogen concentration at an interface between the piezoelectric material substrate and silicon oxide layer is higher than a nitrogen concentration at an interface between the silicon oxide layer and the supporting substrate.

3 Claims, 3 Drawing Sheets

(51) Int. Cl.
*H03H 3/08* (2006.01)
*H03H 9/25* (2006.01)
*H10N 30/20* (2023.01)
*H10N 30/086* (2023.01)
*H10N 30/88* (2023.01)
*H10N 30/853* (2023.01)

(52) U.S. Cl.
CPC .......... *H10N 30/086* (2023.02); *H10N 30/20* (2023.02); *H10N 30/8542* (2023.02); *H10N 30/88* (2023.02)

(56) References Cited

U.S. PATENT DOCUMENTS

| | | |
|---|---|---|
| 2004/0226162 A1 | 11/2004 | Miura et al. |
| 2013/0285768 A1 | 10/2013 | Watanabe et al. |
| 2014/0173862 A1* | 6/2014 | Kando ................. H01L 41/187 29/25.35 |
| 2017/0201232 A1 | 7/2017 | Nakamura et al. |
| 2017/0298958 A1 | 10/2017 | Mochizuki et al. |
| 2018/0102761 A1* | 4/2018 | Takai ................. H03H 9/14544 |
| 2018/0175283 A1 | 6/2018 | Akiyama et al. |
| 2019/0036509 A1 | 1/2019 | Tai et al. |

FOREIGN PATENT DOCUMENTS

| | | |
|---|---|---|
| JP | 2010178013 A | 8/2010 |
| JP | 5910763 B2 | 4/2016 |
| JP | 2016225537 A | 12/2016 |
| JP | 201745676 A | 3/2017 |
| JP | 2017123576 A | 7/2017 |
| JP | 2017190744 A | 10/2017 |
| JP | 2018207355 A | 12/2018 |
| WO | 2006114922 A1 | 11/2006 |
| WO | 2009081651 A1 | 7/2009 |
| WO | 2017163729 A1 | 9/2017 |

OTHER PUBLICATIONS

Torchinsky et al. "Interface modification and bonding of lithium tantalate crystals", Appl. Phys. Lett. 92, 052903 (2008); (Year: 2008).*
Japanese language International Search Report for corresponding PCT/JP2018/041798, dated Jan. 22, 2019 (3 pages).
Japanese language Written Opinion for corresponding PCT/JP2018/041798 dated Jan. 22, 2019 (6 pages).
Notice of Reasons for Refusal with English Translation for JP 2019-509562 date of drafting Mar. 26, 2019 (14 pages).
Notice of Reasons for Refusal with English Translation for JP 2019-509562 date of drafting Jun. 25, 2019 (10 pages).
Notice of Reasons for Refusal with English Translation for JP 2019-509562 date of drafting Nov. 15, 2019 (6 pages).
Yoshikaju Zikuhara et al., ECS Transactions, 3 (6) 91-98 (2006) Sequential activation of oxygen RIE and nitrogen radical for LiTaO3 and Si wafer bonding (8 pages).
T. Plach et at., Mechanisms for room temperature direct wafer bonding, Journal of Applied Physics 113, 094905 (2013) (8 pages).
English language International Preliminary Report on Patentability and Written Opinion of the International Searching Authority, issued in corresponding International Application No. PCT/JP2018/041798, dated Jan. 22, 2019 (9 pages).

* cited by examiner

ASSEMBLY OF PIEZOELECTRIC MATERIAL SUBSTRATE AND SUPPORT SUBSTRATE, AND METHOD FOR MANUFACTURING SAID ASSEMBLY

CROSS-REFERENCE TO RELATED APPLICATIONS

This application is a continuation application of PCT/JP2018/041798, filed Nov. 12, 2018, which claims priority to Japanese Application No. 2017-252831, filed Dec. 28, 2017, the entire contents all of which are incorporated hereby by reference.

TECHNICAL FIELD

The present invention relates to a bonded body of a piezoelectric material substrate and supporting substrate, an acoustic wave device and a method of producing the same.

BACKGROUND ARTS

It has been widely used an SOI substrate composed of a high resistance $Si/SiO_2$ thin film/Si thin film, for realizing a high-performance semiconductor device. Plasma activation is used for realizing the SOI substrate. This is because the bonding can be realized at a relatively low temperature (400° C.). It is proposed a composite substrate composed of similar $Si/SiO_2$ thin film/piezoelectric thin film for improving the characteristics of a piezoelectric device (patent document 1). According to patent document 1, the piezoelectric material substrate composed of lithium niobate or lithium tantalate and silicon substrate with the silicon oxide layer formed thereon are activated by ion activation method, followed by the bonding.

It is further proposed a filter of multi-layered structure by forming a single or multiple dielectric film at an interface (patent document 2).

However, there is few know information relating to the bonding technique for realizing the structure of lithium tantalate/silicon oxide/silicon.

Patent document 3 discloses that lithium tantalate and sapphire or ceramic are bonded through a silicon oxide layer by plasma activation method.

According to non-patent document 1, it is described that lithium tantalate substrate and a silicon substrate with a silicon oxide film provided thereon are bonded with each other by irradiating $O_2$ plasma of RIE (13.56 MHz) and microwave (2.45 GHz) of $N_2$ in series.

When Si and $SiO_2$/Si are bonded with each other by plasma activation, a sufficiently high bonding strength is obtained by the formation of Si—O—Si bond at the interface. Further, at the same time, Si is oxidized to $SiO_2$ so that the flatness is improved and the bonding as described above is facilitated at the uppermost surface (Non-patent document 2).

PRIOR TECHNICAL DOCUMENTS

Non-Patent Documents (Non-Patent Document 1)
ECS Transactions, 3 (6) 91-98 (2006)
(Non-Patent Document 2)
J. Applied Physics 113, 094905 (2013)

Patent Documents (Patent document 1) Japanese Patent Publication No. 2016-225537A
(Patent document 2) Japanese Patent No. 5910763B
(Patent document 3) Japanese Patent No. 3774782B

SUMMARY OF THE INVENTION

Object to be Solved by the Invention

As described in the prior documents, in the case that as piezoelectric device is produced by thinning a lithium niobate or lithium tantalate substrate by ion injection, the characteristics is low which is problematic. This is because that the crystallinity is deteriorated due to the damage during the ion injection.

On the other hand, in the case that a piezoelectric material substrate such as lithium niobate or lithium tantalate is bonded to a silicon oxide layer on a silicon substrate and that the piezoelectric material substrate is then polished to make the substrate thinner, a processing denatured layer can be removed by CMP so that the device characteristics are not deteriorated. However, as the thickness of the piezoelectric material layer is made smaller by polishing, the characteristics of the thus obtained bonded body may be deteriorated. Particularly in the case that the bonded body is used as an acoustic wave device, it is proved that the characteristics as the acoustic wave device, particularly a ratio (admittance ratio) of an admittance at a resonance frequency fs with respect to an admittance at an anti-resonance frequency fr, is reduced. In the case that the thickness of the piezoelectric material substrate is 4.0 μm or smaller and further 3.0 μm or lower (particularly 2.0 μm or smaller), the tendency of the reduction becomes more considerable.

An object of the present invention is, in bonding a piezoelectric material substrate of a material selected from the group consisting of lithium niobate, lithium tantalate and lithium-niobate-lithium tantalate and a supporting substrate with a silicon oxide layer formed thereon, to suppress deterioration of performance of a bonded body.

Solution for the Object

The present invention provides a bonded body comprising:
 a supporting substrate;
 a silicon oxide layer provided on the supporting substrate; and
 a piezoelectric material substrate provided on the silicon oxide layer, the piezoelectric material substrate comprising a material selected from the group consisting of lithium niobate, lithium tantalate and lithium niobate-lithium tantalate,
 wherein a nitrogen concentration at an interface between the piezoelectric material substrate and the silicon oxide layer is higher than a nitrogen concentration at an interface between the silicon oxide layer and the supporting substrate.

The present invention further provides an acoustic wave device comprising the bonded body and an electrode provided on the piezoelectric material substrate.

The present invention further provides a method of bonding a piezoelectric material substrate comprising a material selected from the group consisting of lithium niobate, lithium tantalate and lithium niobate-lithium tantalate and a supporting substrate comprising an silicon oxide layer provided thereon, the method comprising the steps of:
 irradiating nitrogen plasma onto a bonding face of the piezoelectric material substrate at a temperature of 150° C. or lower to active the bonding face; and then bonding the bonding face of the piezoelectric material substrate to a bonding face of the silicon oxide layer.

The present invention further provides a method of producing an acoustic wave device, the method comprising the step of:
providing an electrode on the piezoelectric material substrate after the bonded body is obtained according to the method described above.

Effects of the Invention

The inventors have researched the reason that the characteristic of the bonded body is deteriorated when the piezoelectric material substrate composed of lithium niobate or the like and the supporting substrate with the silicon oxide layer are directly bonded with each other. Particularly, it is studied in detail the reason that a ratio (admittance ratio) of an admittance at a resonance frequency fs with respect to an admittance at an anti-resonance frequency fr is reduced. The following findings were thus obtained.

That is, in the case that Si and SiO$_2$/Si are bonded by plasma activation, for example, Si—O—Si bond is formed along the interface, resulting in a sufficiently high bonding strength. Further, Si is oxidized into SiO$_2$ at the same time, so that the flatness is improved and the bonding as described above is facilitated at the uppermost surface (non-patent document 2: J. Applied Physics 113, 094905 (2013)).

Contrary to this, in the case that lithium niobate or lithium tantalate is directly bonded to the supporting substrate with the silicon oxide layer formed thereon, Ta—(Nb)—O—Si bond is formed along the bonding interface to perform the bonding. However, the density of Si atoms at the uppermost surface of SiO$_2$/Si is 6.8 counts/Å$^2$. On the other hand, the density of Ta(Nb) atoms at the uppermost surface of the piezoelectric material substrate is 4.3 counts/Å$^2$ or lower, for example, indicating that the atomic density at the uppermost surface is low, although the density is dependent on the cut angle as the crystal belongs to anisotropic crystal. Further, it is considered that lithium niobate or lithium tantalate does not have the mechanism of smoothening by oxidation, different from silicon, and that a sufficiently high bonding strength is thus not obtained.

It is thus considered as follows. In the case that a piezoelectric material substrate composed of lithium niobate or lithium tantalate is processed after the piezoelectric material substrate is directly bonded to SiO$_2$/Si, as the piezoelectric material substrate becomes thinner, a shear force is applied on the silicon oxide layer and a region on the side of the silicon oxide layer of the supporting substrate, resulting in the deterioration of the crystallinity.

Based on such hypothesis, the inventors have tried to provide a part having a relatively high nitrogen concentration along the interface between the piezoelectric material substrate and silicon oxide layer. It is thus found that the reduction of characteristic due to the deterioration of crystallinity in the silicon oxide layer or the region on the side of the silicon oxide layer of the supporting substrate can be suppressed. The present invention is thus made.

Further, nitrogen plasma is irradiated onto the bonding face of the piezoelectric material substrate at a temperature of 150° C. or lower to activate the bonding face and the bonding face of the piezoelectric material substrate is then bonded to the bonding face of the silicon oxide layer, so that it is found that the generation of the region having a relatively high nitrogen concentration along the interface of the piezoelectric material substrate and silicon oxide layer is facilitated.

EMBODIMENTS FOR CARRYING OUT THE INVENTION

Figure 1A:
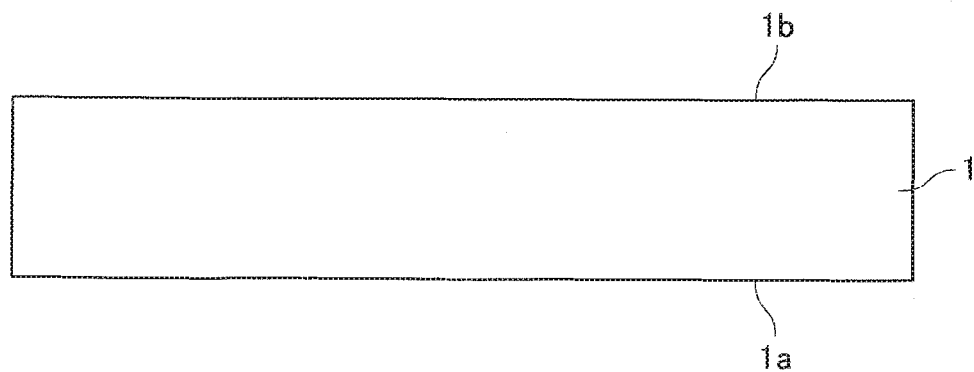
FIG. 1(a) shows a piezoelectric material substrate 1.

The present invention will be described in detail below, appropriately referring to the drawings.

Figure 1B:
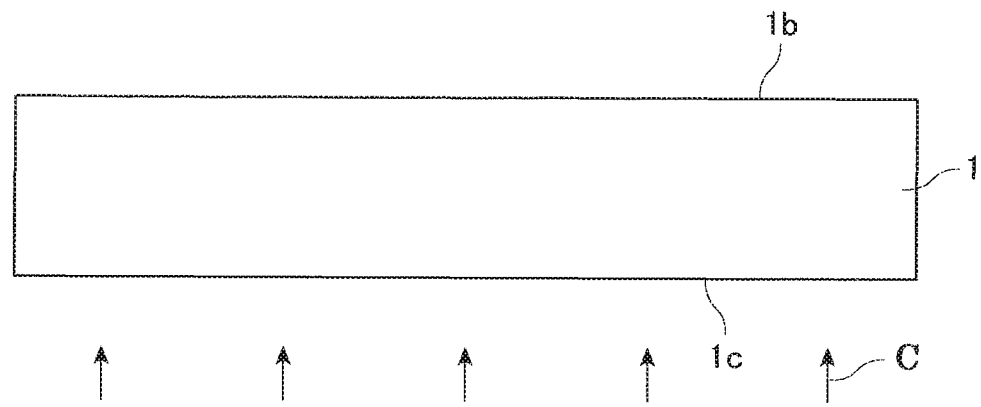
FIG. 1(b) shows the state that a bonding face of the piezoelectric material substrate 1 is activated to generated an activated face 1c.

First, as shown in FIG. 1(a), it is prepared a piezoelectric material substrate 1 having a pair of main faces 1a and 1b. According to the present example, 1a is assigned to the bonding face. Then, as shown in FIG. 1(b), plasma is irradiated onto the bonding face 1a of the piezoelectric material substrate 1 as arrows C to obtain a surface activated bonding face 1c.

Figure 2A:
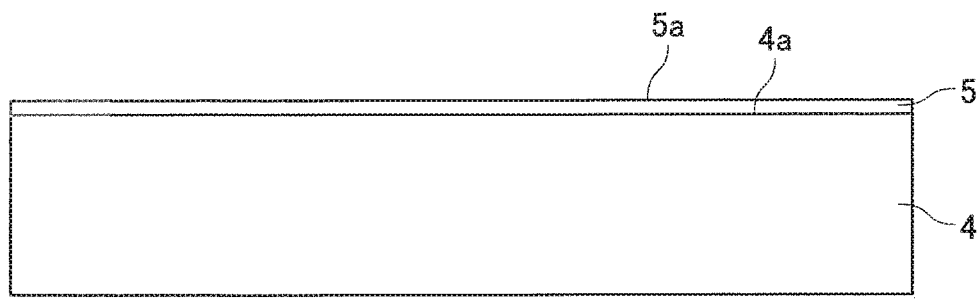
FIG. 2(a) shows the state that a silicon nitride layer 5 is formed on a surface of a supporting substrate 4.
Figure 2B:
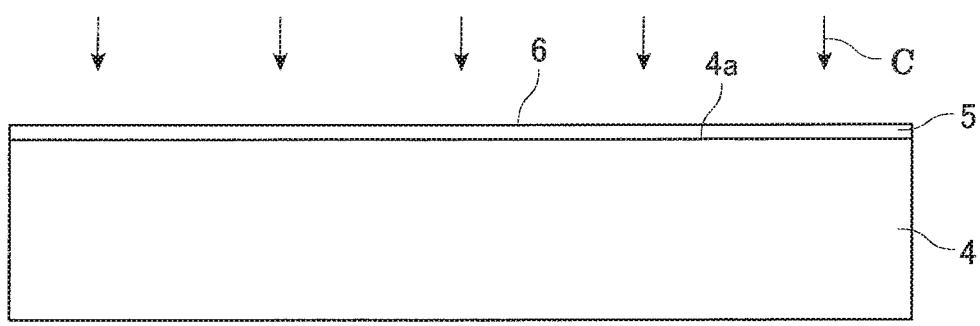
FIG. 2(b) shows the state that a surface of the silicon nitride layer 5 is activated.

Further, as shown in FIG. 2(a), it is formed a silicon nitride layer 5 on a surface 4a of a supporting substrate 4. Then, as shown in FIG. 2(b), plasma is irradiated onto a surface 5a of the silicon nitride layer 5 as arrows C to perform the surface activation to form an activated bonding face 6.

Figure 3A:
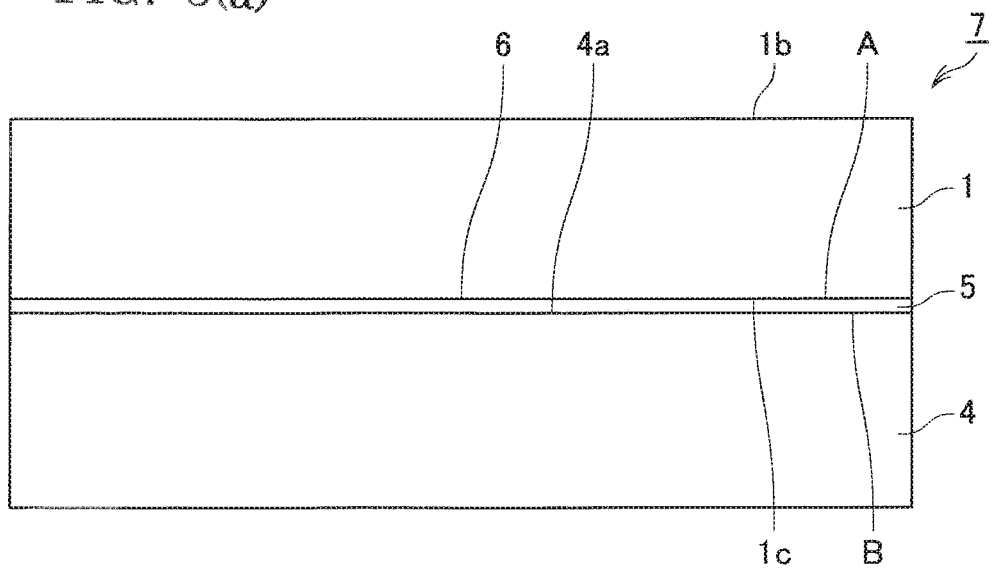
FIG. 3(a) shows a bonded body 7 obtained by directly bonding the piezoelectric material substrate 1 and silicon nitride layer 5 on the supporting substrate 4.
Figure 3B:
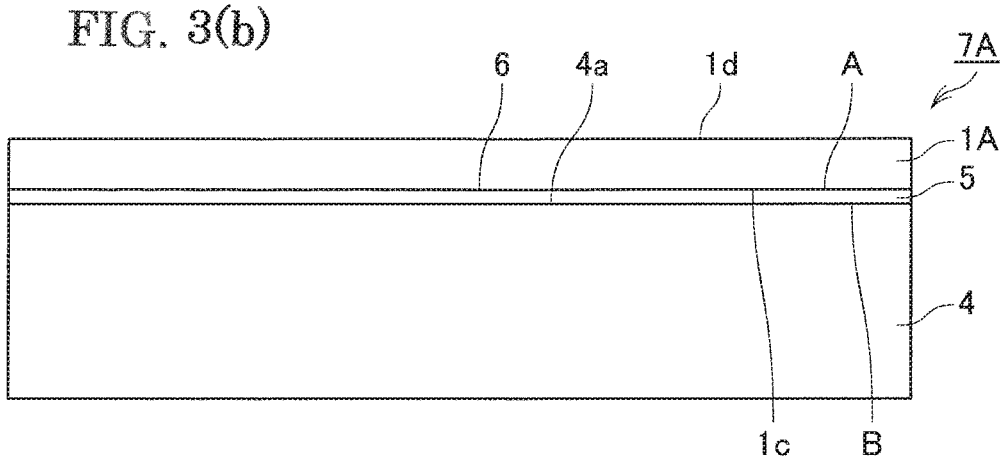
FIG. 3(b) shows the state that a piezoelectric material substrate 1A on a bonded body 7A is thinned by polishing.
Figure 3C:
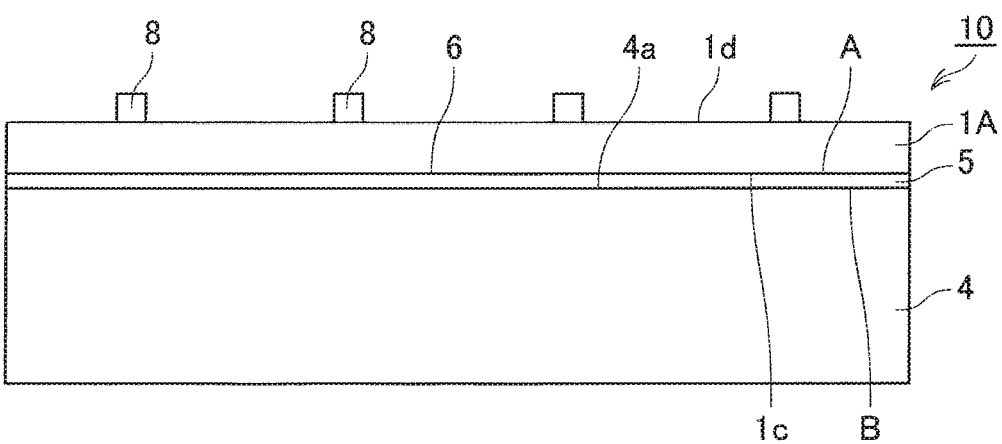
FIG. 3(c) shows an acoustic wave device.

Then, as shown in FIG. 3(a), the activated bonding face 1c of the piezoelectric material substrate 1 and the activated surface 6 of the silicon nitride layer 5 on the supporting substrate 4 are contacted to each other for performing the direct bonding to obtain a bonded body 7. At this state, an electrode may be provided on the piezoelectric material substrate 1. However, preferably, as shown in FIG. 3(b), the main face 1b of the piezoelectric material substrate 1 is processed for thinning the substrate 1 to obtain a thinned piezoelectric material substrate 1A. 1d represents a processed face. Then, as shown in FIG. 3(c), a predetermined electrode 8 is formed on the processed face 1d of the piezoelectric material substrate 1A of a bonded body 7A to obtain an acoustic wave device 10.

Here, according to the present invention, a nitrogen concentration NA (refer to FIG. 3) at an interface A between the piezoelectric material substrate 1(1A) and silicon nitride layer 5 is higher than a nitrogen concentration NB at an interface B between the silicon nitride layer 5 and supporting substrate 4, indicating that there is a region whose nitrogen concentration is relatively higher along the interface A. In the case that there is the region whose nitrogen concentration is higher along the interface A, nitrogen is normally diffused into the silicon nitride layer 5, so that gradient of nitrogen concentration is present within the silicon oxide layer 5 and the nitrogen concentration is relatively low at the interface B. However, the present invention is not limited to this embodiment and includes the embodiment that the nitrogen concentration in the silicon nitride layer 5 has no gradient and is constant, as long as the nitrogen concentration NA at the interface A between the piezoelectric material substrate 1(1A) and silicon nitride layer 5 is higher than the nitrogen concentration NB at the interface B between the silicon nitride layer 5 and supporting substrate 4.

Here, a ratio (NA/NB) of the nitrogen concentration NA at the interface A between the piezoelectric material substrate 1(1A) and silicon nitride layer 5 with respect to the nitrogen concentration NB at the interface B between the silicon oxide layer 5 and supporting substrate 4 may preferably be 10 or higher and more preferably be 100 or higher. Further, the ratio (NA/NB) may preferably be 1000 or lower on practical viewpoint.

According to a preferred embodiment, the nitrogen concentration NA at the interface A between the piezoelectric material substrate 1(1A) and silicon oxide layer 5 is 1 E 1 9 to 1 E 2 1 ($1 \times 10^{19}$ to $1 \times 10^{21}$) atoms/cm³, and more preferably be 5 E 1 9 to 5 E 2 0 ($5 \times 10^{19}$ to $5 \times 10^{20}$) atoms/cm³. Further, the nitrogen concentration NB at the interface B between the silicon oxide layer 5 and supporting substrate 4 may preferably be 1 E 1 9 ($1 \times 10^{19}$) atoms/cm³ or lower and more preferably be 7 E 1 8 ($7 \times 10^{18}$) atoms/cm³ or lower.

According to a preferred embodiment, a carbon concentration CA at the interface A between the piezoelectric material substrate and silicon oxide layer is higher than a carbon concentration CB at the interface B between the silicon oxide layer and supporting substrate. Further, a ratio (CA/CB) of the carbon content CA at the interface A between the piezoelectric material substrate 1 (1A) and the silicon oxide layer 5 with respect to the carbon concentration CB at the interface B between the silicon oxide layer 5 and supporting substrate 4 may preferably be 100 or higher and more preferably be 1000 or higher. Further, the ratio (CA/CB) may preferably be 1000 or lower on the practical viewpoint.

Further, according to a preferred embodiment, the carbon concentration CA at the interface A between the piezoelectric material substrate 1(1A) and silicon oxide layer 5 may more preferably be 1 E 2 0 to 3 E 2 1 ($1 \times 10^{20}$ to $3 \times 10^{21}$) atoms/cm³. Further, the carbon concentration CB at the interface B between the silicon oxide layer 5 and supporting substrate 4 may more preferably be 1 E 1 8 ($1 \times 10^{18}$) atoms/cm³ or lower.

According to a preferred embodiment, a fluorine concentration FA at the interface A between the piezoelectric material substrate and silicon oxide layer is higher than a fluorine concentration FB at the interface B between the silicon oxide layer and supporting substrate. Further, a ratio (FA/FB) of the fluorine concentration FA at the interface A between the piezoelectric material substrate 1(1A) and silicon oxide layer 5 with respect to the fluorine concentration FB at the interface B between the silicon oxide layer 5 and supporting substrate 4 may preferably be 5 or higher and more preferably be 50 or higher. Further, the ratio (FA/FB) may preferably be 500 or lower on the practical viewpoint.

Further, the fluorine concentration FA at the interface A between the piezoelectric material substrate 1(1A) and silicon oxide layer 5 may preferably be 1 E 1 9 to 3 E 2 0 ($1 \times 10^{19}$ to $3 \times 10^{20}$) atoms/cm³. Further, the fluorine concentration FB at the interface B between the silicon oxide layer 5 and supporting substrate 4 may preferably be 5 E 1 8 ($5 \times 10^{18}$) atoms/cm³ or lower.

The respective constituents of the present invention will be described further in detail below.

Although the material of the supporting substrate 4 is not particularly limited, preferably, the material is selected from the group consisting of silicon, quartz, sialon, mullite, sapphire and translucent alumina. It is thus possible to further improve the temperature characteristics of frequency of an acoustic wave device 10.

The silicon oxide layer 5 is formed on the supporting substrate 4. Although the method of film-forming the silicon oxide layer 5 is not particularly limited, sputtering, chemical vapor deposition (CVD) and vapor deposition may be listed. Preferably, the supporting substrate 4 is a silicon substrate, and in this case, the silicon oxide layer 5 can be formed by sputtering of oxygen or ion injection onto the surface of the silicon substrate, or by heating under oxidizing atmosphere.

The thickness of the silicon oxide layer 5 may preferably be 0.05 µm or larger, more preferably be 0.1 µm or larger and particularly preferably be 0.2 µm or larger, on the viewpoint of the present invention. Further, the thickness of the silicon oxide layer 5 may preferably be 3 µm or smaller, preferably 2.5 µm or smaller and more preferably be 2.0 µm or smaller.

The piezoelectric material substrate 1(1A) used in the present invention is made single crystals of lithium tantalate (LT), lithium niobate (LN) or lithium niobate-lithium tantalate solid solution. As the materials have high propagation speeds of a surface acoustic wave and large electro-mechanical coupling factors, it is preferred for use in a piezoelectric surface wave device for high frequency and wide-band frequency applications.

Further, the normal direction of the main surface of the piezoelectric single crystal substrate 1(1A) is not limited. For example, in the case that the piezoelectric single crystal substrate 1(1A) is made of LT, it is preferred to use the substrate rotated from Y-axis toward Z-axis by 32 to 50° (180°, 58° to 40°, 180° on Eulerian angle representation) around X-axis, which is a direction of propagation of a surface acoustic wave, because of a low propagation loss. In the case that the piezoelectric single crystal substrate 1(1A) is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, to 25°, 180° on Eulerian angle representation) around X-axis, which is a direction of propagation of a surface acoustic wave, because a high acoustic speed can be obtained. Further, although the size of the piezoelectric material substrate 1(1A) is not particularly limited, for example, the diameter may be 100 to 200 mm and thickness may be 0.15 to 1 µm.

Plasma is then irradiated onto the bonding face 1a of the piezoelectric material substrate 1 at a temperature of 150° C. or lower to activate the bonding face 1a. Although it is preferred to irradiate nitrogen plasma on the viewpoint of the present invention, the bonded body of the present invention can be obtained even in the case that oxygen plasma is irradiated.

The pressure during the surface activation may preferably be 100 Pa or lower and more preferably be 80 Pa or lower. Further, the atmosphere may be composed of nitrogen only, oxygen only, or mixture of nitrogen and oxygen.

The temperature during the irradiation of the plasma is made 150° C. or lower. It is thereby possible to obtain the bonded bodies 7 and 7A, each having a high bonding strength and no deterioration of the crystallinity. On the viewpoint, the temperature during the plasma irradiation is made 150° C. or lower and may more preferably be 100° C. or lower.

Further, the energy of the irradiated plasma may preferably be 30 to 150 W. Further, a product of the energy of the irradiated plasma and irradiation time period may preferably be 0.12 to 1.0 Wh.

According to a preferred embodiment, the bonding face 1a of the piezoelectric material substrate 1 and the bonding face 5a of the silicon oxide layer 5 are subjected to flattening process before the plasma treatment. The method of flattening the respective bonding faces 1a and 5a includes lapping, chemical mechanical polishing (CMP) and the like. Further, the flattened face may preferably have Ra of 1 nm or lower and more preferably have Ra of 0.3 nm or lower.

The bonding face 5a of the silicon oxide layer 5 may also be subjected to plasma treatment. At this time, plasma of oxygen, nitrogen or the like may be used, and nitrogen plasma and oxygen plasma are particularly preferred. Further, the temperature during the plasma treatment may preferably be 150° C. or lower and more preferably be 100° C. or lower.

Further, the pressure during the irradiation of plasma onto the bonding face 5a of the silicon oxide layer 5 may preferably be 100 Pa or lower and more preferably be 80 Pa or lower. The energy during the irradiation may preferably 30 to 150 W. Further, a product of the energy during the plasma irradiation and time period of the irradiation may preferably be 0.12 to 1.0 Wh.

The bonding face 1c of the piezoelectric material substrate 1 and bonding face 6 of the silicon oxide layer 5 are contacted and bonded with each other. Thereafter, annealing treatment may preferably be performed to improve the bonding strength. The temperature during the annealing may preferably be 100° C. or higher and 300° C. or lower.

The bonded bodies 7 and 7A of the present invention may preferably be applied as an acoustic wave device.

As an acoustic wave device 10, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric single crystal substrate 1 or 1A. By applying high frequency signal on the IDT electrode on the input side, electric field is generated between the electrodes, so that the surface acoustic wave is oscillated and propagated on the piezoelectric substrate 1 or 1A. Then, the propagated surface acoustic wave is drawn as an electrical signal from the IDT electrodes on the output side provided in the direction of the propagation.

A material forming the electrode 8 of the piezoelectric material substrate 1 or 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Inventive Example A1

It was produced an acoustic wave device 10 shown in FIG. 3(c), according to the method described referring to FIGS. 1 to 3.

Specifically, it was prepared a 42Y-cut X-propagation LiTaO$_3$ substrate (piezoelectric material substrate) 1 having a thickness of 200 μm and both main faces polished into mirror surfaces and a high-resistance (>2 kΩ·cm) Si (100) substrate (supporting substrate) 4 having a thickness of 675 μm. Both substrates have sizes of 150 mm, respectively. A silicon oxide layer 5 was film-formed by sputtering in a thickness of 500 nm on the supporting substrate 4. As the silicon oxide layer 5 after the film-formation had a surface roughness Ra of 0.6 nm, the surface was slightly polished by CMP (Chemical mechanical polishing) so that Ra was improved to 0.3 nm.

The bonding face 1a of the piezoelectric material substrate 1 and the bonding face 5a of the silicon oxide layer 5 on the supporting substrate 4 were subjected to cleaning and surface activation, respectively. Specifically, ultrasonic cleaning using pure water was performed, and the substrate surfaces were dried by spin dry. The supporting substrate 4 after the cleaning was then introduced into a plasma activation chamber, and the bonding face 5a was activated by nitrogen gas plasma at 30° C. Further, the piezoelectric material substrate 1 was similarly introduced into the plasma activation chamber, and the bonding face 1a was subjected to surface activation by nitrogen gas plasma at 30° C. The time period of the surface activation was made seconds and the energy was made 100 W. The ultrasonic cleaning and spin dry as described above were performed again for removing particles adhered during the surface activation.

Then, the positioning of the respective substrates 1 and 4 were performed, and the bonding faces 1c and 6 of the substrate 1 and silicon oxide layer 5 were contacted with each other at room temperature. The substrates were contacted with the piezoelectric material substrate 1 positioned upper side. As a result, it was observed the state (so called-bonding wave) that the adhesion of the substrate 1 and silicon oxide layer 5 was spreading, indicating that good preliminary bonding was completed. Then, the bonded body 7 was charged into an oven filled with nitrogen atmosphere and held at 120° C. for 10 hours, for improving the bonding strength.

The nitrogen concentrations, carbon concentrations and fluorine concentrations at the respective parts were measured using SIMS method (secondary ion mass spectroscopy) for the thus obtained bonded bodies 7. As the SIMS measuring system, "CAMECA IMS-7f" was used, Cs+ was used as primary ion specie, and the primary acceleration voltage was made 15.0 kV. The detection region was made 30 μmφ. The results were shown in table 1.

The surface 1b of the piezoelectric material substrate 1 of the bonded body 7 after the heating is subjected to grinding, lapping and CMP processing, so that the thickness of the piezoelectric material substrate 1A was made 16, 8, 4, 2 or 1 μm. The thickness of the piezoelectric material substrate 1A was measured by an optical measurement system ("F20" supplied by Filmetrix Corporation) applying optical interference. An IDT electrode 8 made of aluminum metal was provided on the surface 1d of the polished piezoelectric material substrate 1A by photolithography process. The period λ of the electrode was made 4 μm, so that oscillation frequency becomes about 1000 MHz. The thickness of the IDT electrode 8 was made 200 nm and it was provided 80 pairs of reflectors on both sides of the 200 pairs of IDT electrodes 8, respectively, to produce an acoustic wave device 10 (SAW resonator) of 1 port. The impedance characteristics of the thus produced acoustic wave device (SAW resonator) 10 was measured by a network analyzer "E5071C" supplied by Agilent Corporation. As result, it was observed a resonance peak at about 1000 MHz (fs) and anti-resonance peak at about 1050 MHz (fr). The ratio of the admittance value at the resonance frequency fs with respect to the admittance value at the anti-resonance frequency fr was measured. The results were shown in table 3.

Inventive Example A2

In the inventive example A1, plasma of mixed gases of 80 percent of nitrogen gas and 20 percent of oxygen gas was used instead of nitrogen plasma. When the gas composition was changed, the matching was appropriately changed so that the reflection electric power took the minimum value. The other conditions were the same as those in the inventive example A1.

According to same procedure as the inventive example A1, nitrogen concentrations, carbon concentrations and fluorine concentrations at the respective parts in the thus obtained bonded body 7 were measured and the measurement results were shown in table 1. Further, as the inventive example A1, the bonded bodies were processed so that the thickness of the piezoelectric material substrate 1A was made 16, 8, 4, 2 or 1 μm. The ratio of the admittance value at the resonance frequency fs with respect to the admittance value at the anti-resonance frequency fr was measured. The results were shown in table 3.

Comparative Example A1

According to the same procedure as the inventive example A1, the bonded bodies 7, 7A and acoustic wave device 10 (SAW device) were produced, and the measurement as the inventive example A1 was performed. However, the silicon oxide layer 5 was film-formed on the piezoelectric material substrate 1 and was not formed on the side of the supporting substrate 4. Further, the surface activation of the silicon oxide layer 5 and supporting substrate 4 was performed, and the activated surfaces of the silicon oxide layer 5 and supporting substrate 4 were directly bonded with each other by irradiating nitrogen plasma.

The nitrogen concentrations, carbon concentrations and fluorine concentrations at the respective parts in the thus obtained bonded bodies were measured, and the measurement results were shown in table 2. Further, according to the same procedure as the inventive example A1, the processing was performed so that the thickness of the piezoelectric material substrate was made 16, 8, 4, 2 or 1 μm. The ratio of the admittance value at the resonance frequency fs with respect to the admittance value at the anti-resonance frequency fr was measured. The results were shown in table 3.

TABLE 1

| 9.5 | Measurement position | Nitrogen concentration atoms/cm$^3$ | Carbon concentration atoms/cm$^3$ | Fluorine concentration atoms/cm$^3$ |
|---|---|---|---|---|
| Inventive Example A1 | Interface between piezoelectric material substrate and silicon oxide layer | 3.1E20 | 5.7E20 | 8.7E19 |
| | Average value in silicon oxide layer | 1.3E19 | 9.6E18 | 1.6E18 |
| | Interface between supporting substrate and silicon oxide layer | 1.5E19 | 3.0E17 | 1.1E18 |

TABLE 1-continued

| 9.5 | Measurement position | Nitrogen concentration atoms/cm$^3$ | Carbon concentration atoms/cm$^3$ | Fluorine concentration atoms/cm$^3$ |
|---|---|---|---|---|
| Inventive Example A2 | Interface between piezoelectric material substrate and silicon oxide layer | 6.4E19 | 1.2E20 | 2.4E19 |
| | Average value in silicon oxide layer | 7.8E18 | 3.6E17 | 1.2E18 |
| | Interface between supporting substrate and silicon oxide layer | 8.2E18 | 5.5E17 | 8.5E18 |

TABLE 2

| | Measurement position | Nitrogen concentration atoms/cm$^3$ | Carbon concentration atoms/cm$^3$ | Fluorine concentration atoms/cm$^3$ |
|---|---|---|---|---|
| Comparative A1 | Interface between piezoelectric material substrate and silicon oxide | 9.9E18 | 7.2E17 | 4.4E18 |
| | Average value in silicon oxide layer | 7.6E18 | 1.2E17 | 8.7E17 |
| | Interface between supporting substrate and silicon oxide layer | 1.7E20 | 1.4E20 | 2.1E19 |

TABLE 3

| Thickness (μm) of piezoelectric material substrate after processing | Inventive Example A1 | Inventive Example A2 | Comparative Example A1 |
|---|---|---|---|
| 16.0 | 42.5 | 44.0 | 43.3 |
| 8.0 | 40.7 | 42.5 | 42.8 |
| 4.0 | 43.3 | 42.2 | 40.0 |
| 2.0 | 44.3 | 45.1 | 39.3 |
| 1.0 | 46.5 | 44.9 | 35.8 |

As shown in table 3, according to the acoustic wave devices 10 (SAW devices) of the bonded bodies 7 and 7A of the present invention, even in the case that the thickness of the piezoelectric material substrate 1A was made as extremely thin as 2.0 to 1.0 μm by processing, the ratio of the admittance value at the resonance frequency fs with respect to the admittance value at the anti-resonance frequency fr was not deteriorated and was good. On the other hand, according to the bonded body of the comparative example, as the thickness of the piezoelectric material substrate 1A becomes smaller, the ratio of the admittance value at the resonance frequency fs with respect to the admittance value at the anti-resonance frequency fr was deteriorated. In particular, according to the bonded body of the comparative example A1, as the thickness of the piezoelectric material substrate 1A was made 4.0 μm or smaller, the ratio of the admittance value at the resonance frequency fs with respect to the admittance value at the anti-resonance frequency fs was considerably deteriorated.

Inventive Example B

In the inventive example A1, the piezoelectric material substrates 1 and 1A were changed to 128Y-cut X-propagation lithium niobate. As a result, it was obtained results similar to those obtained in the inventive example A1.

The invention claimed is:

1. A bonded body comprising:
   a supporting substrate;
   a silicon oxide layer provided on said supporting substrate; and
   a piezoelectric material substrate provided on said silicon oxide layer, said piezoelectric material substrate comprising a material selected from the group consisting of lithium niobate, lithium tantalate and lithium niobate-lithium tantalate,
   wherein a nitrogen concentration at an interface between said piezoelectric material substrate and said silicon oxide layer is higher than a nitrogen concentration at an interface between said silicon oxide layer and said supporting substrate,
   wherein a carbon concentration at said interface between said piezoelectric material substrate and said silicon oxide layer is higher than a non-zero carbon concentration at said interface between said silicon oxide layer and said supporting substrate.

2. The bonded body of claim 1, wherein a fluorine concentration at said interface between said piezoelectric material substrate and said silicon oxide layer is higher than a fluorine concentration between said silicon oxide layer and said supporting substrate.

3. The bonded body of claim 1, wherein said piezoelectric material substrate has a thickness of 4 µm or smaller.

* * * * *